US006861674B2

(12) United States Patent
Perlo et al.

(10) Patent No.: US 6,861,674 B2
(45) Date of Patent: Mar. 1, 2005

(54) ELECTROLUMINESCENT DEVICE

(75) Inventors: Piero Perlo, Sommariva Bosco (IT); Nello Li Pira, Fossano (IT); Rossella Monferino, Turin (IT); Piermario Repetto, Turin (IT); Vito Lambertini, Giaveno (IT); Marzia Paderi, Turin (IT)

(73) Assignee: C.R.F. Societa Consortile per Azioni, Turin (IT)

( * ) Notice: Subject to any disclaimer, the term of this patent is extended or adjusted under 35 U.S.C. 154(b) by 37 days.

(21) Appl. No.: 10/470,310

(22) PCT Filed: Dec. 18, 2002

(86) PCT No.: PCT/IB02/05543

§ 371 (c)(1),
(2), (4) Date: Jul. 29, 2003

(87) PCT Pub. No.: WO03/058728

PCT Pub. Date: Jul. 17, 2003

(65) Prior Publication Data

US 2004/0245647 A1 Dec. 9, 2004

(30) Foreign Application Priority Data

Dec. 18, 2002 (IT) .................................... TO2002A0033

(51) Int. Cl.[7] ................................................ H01L 27/15
(52) U.S. Cl. ................................ 257/81; 257/87; 257/3
(58) Field of Search ................................ 257/81, 87, 3

(56) References Cited

U.S. PATENT DOCUMENTS 5,796,120 A 8/1998 Summers
6,214,738 B1 * 4/2001 Aiba et al. .................. 438/707

OTHER PUBLICATIONS

Pira N. Li. et al.: "Modeling and Experimental Evidence of Quantum Phenomena in Metallic non–Continuous Films (Metal Quantum Wire Network—MQWN—)", Proceedings of the EUSPEN. International Conference, XX, XX, vol., I, May 27, 2001, pp. 212–215, XP008014567.

N. T. Bagraev et al.: "Light Emission from Erbium–doped Nanostructures Embedded in Silicon Microcavities", Tenth International Conference on Modulated Semiconductor Structures. MSS 10, Linz, Austria, Jul. 23–27, 2001, vol. 13, No. 2–4, pp. 1059–1062, XP002240658, Physica E, Mar. 2002, Elsevier, Netherlands, ISSN: 1386–9477.

Naokatsu et al.: "Inverse–pecolation model for investigating a mechanism of formation and photoluminescence of porous silicon", J. Lumin; journal of Luminescence 1999, Elsevier Science Publishers B.V., Amsterdam, Netherlands, vol. 82, No. 1, 1999, pp. 85–90, XP002240659, ISSN: 0022–2313.

* cited by examiner

*Primary Examiner*—David Nelms
*Assistant Examiner*—Tu-Tu Ho
(74) *Attorney, Agent, or Firm*—Sughrue Mion, PLLC

(57) ABSTRACT

An electroluminescent device (1) comprises a supporting substrate (2); at least two electrodes (3) positioned on the substrate (2); at least a three-dimensional percolated layer (4), positioned on the substrate (2) between the two electrodes (3), having a metallic mesoporous structure defining a multitute of cavities of micrometric or nanometric dimensions. Present in the cavities of the three-dimensional percolated layer (4) are a multitude of luminescent inclusions (5), which operate to emit light when energized by electrons which, as a result of electron tunneling, effect pass through the three-dimensional percolated layer (4).

17 Claims, 2 Drawing Sheets

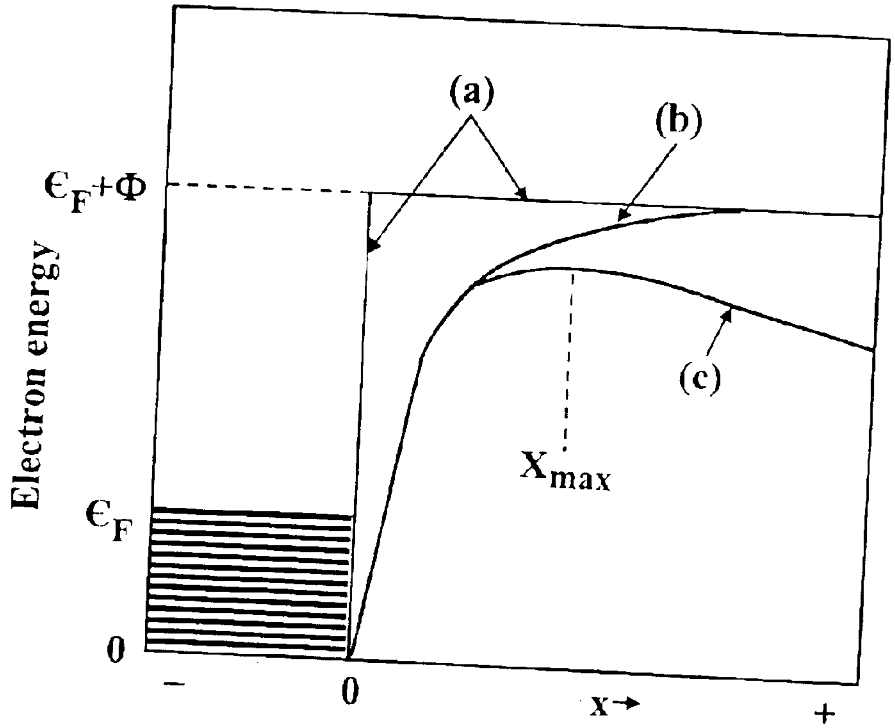
Fig. 1
Distance
Fig. 2
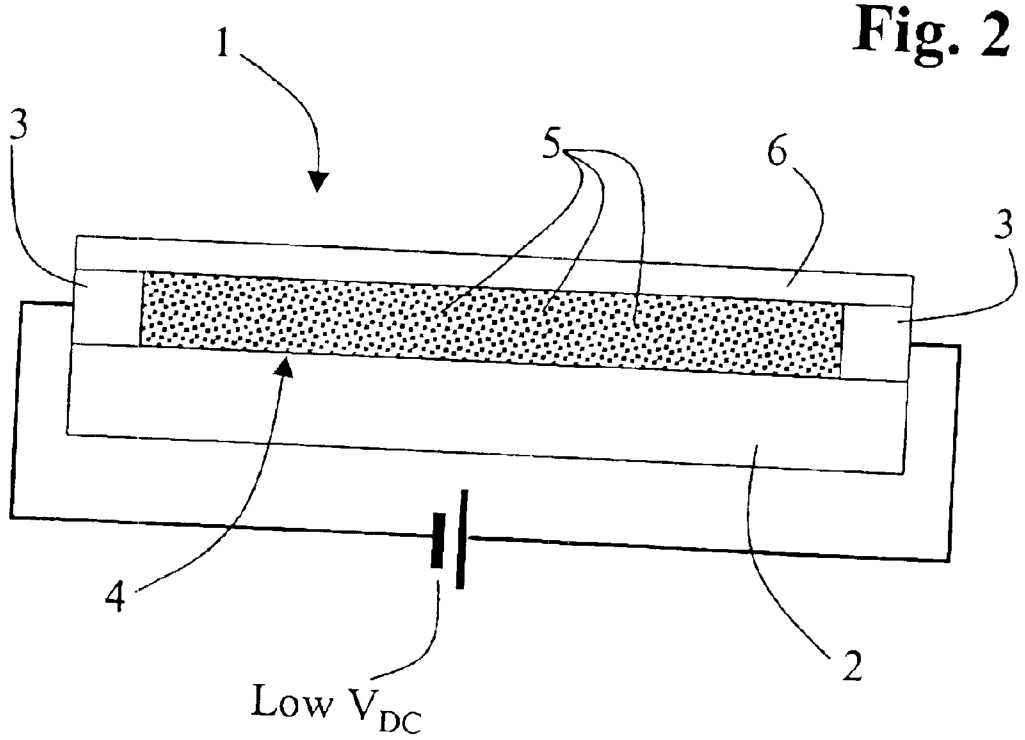

ELECTROLUMINESCENT DEVICE

This is a National Stage Entry of Application No. PCT/IB02/05543 filed Dec. 18, 2002; the disclosure of which is incorporated herein by reference.

BACKGROUND OF THE INVENTION

The present invention relates to an, electroluminescent device.

More specifically, the present invention proposes the production of an electroluminescent device of novel conception, which is particularly susceptible to be applied to the field of photonics and is on a competitive level with traditional electroluminescent devices, such as LED and O-LED, both in terms of costs and attainable performances.

SUMMARY OF THE INVENTION

The object is attained, according to the present invention, by an electroluminescent device having the characteristics of the attached claims, which are an integral part of the present description.

BRIEF DESCRIPTION OF THE DRAWINGS

Further objects, characteristics and advantages of the present invention shall become apparent from the description hereunder and the attached drawings, provided purely as a non-limitative example in which:

FIG. 1 is a graphic representation of the potential barrier between a generic metal and the vacuum, in different conditions;

FIG. 2 is a schematic representation of an electroluminescent device produced in accordance with the present invention;

DETAILED DESCRIPTION OF THE INVENTION

Figure 3:
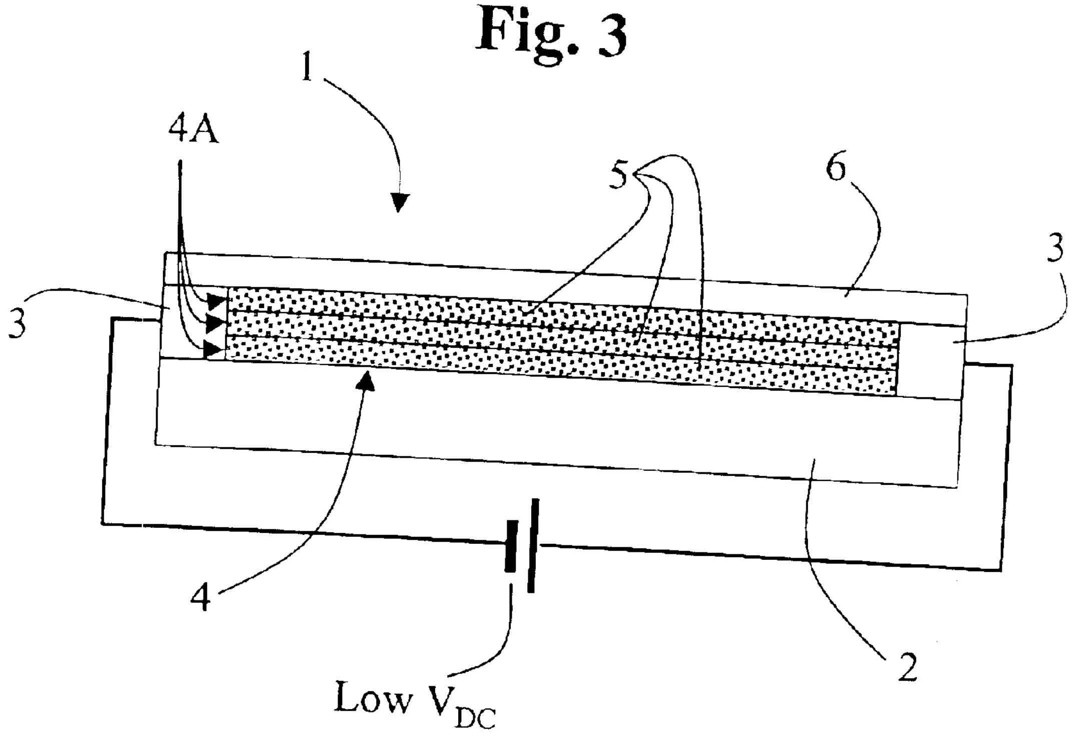
FIG. 3 is a schematic representation of an electroluminescent device produced in accordance with a first possible variant of the present invention.

The electroluminescent device according to the invention is based on the tunneling effect in a three-dimensional percolated layer.

A three-dimensional percolated layer is a metallic mesoporous structure, composed of metallic nanoparticles interconnected with one another or dielectric metallic interconnections connected in such a way as to guarantee electrical conduction; the interconnection or connection may be produced by tunneling, as will be explained hereunder. According to the invention, the cavities of micrometric or nanometric dimensions which are found in the mesoporous structure house luminescent nanoparticles or macromolecules; as will be seen, these emit light when, they are energized by the electrons which, as a result, of tunneling, pass through the percolated layer.

The commonly accepted definition for mesoporous materials comprises inorganic materials with pores with dimensions below 50 nm. Porous materials with pores of nanometric dimensions are the most difficult to produce. In particular, for orderly mesoporous materials “supramolecular templating” techniques are generally utilized, which use asymmetrical organic molecules as templates, to be removed once the nanoporous structure has been established. Metallic mesoporous materials can instead be grown using evaporation techniques, such as thermal evaporation or electron beam evaporation.

With regard to tunneling effect, it must here be considered that the metal-insulator interface is a typical situation inside a metallic system at percolation level, which occurs at each discontinuity of the system.

There are various electron transport mechanisms through the metal-insulator interface, such as ohmic conduction, ionic conduction, thermal emission and field effect emission. In a given material, each of the aforesaid mechanisms prevails in a certain temperature and voltage range (electric field) and has a characteristic dependence on the current, the voltage and the temperature. These different processes are not necessarily independent from one another.

Field emission, also called Fowler-Nordheim electron tunneling, consists in transporting electrons through a metal-insulator interface due to the passage, by tunneling effect, of the electrons from the Fermi level of the metal to the conduction band of the insulator means.

This tunnel effect occurs when there are strong electric fields (hence the term “emission for field effect”) which are able to bend the energy bands of the insulator means to form a narrow triangular potential barrier between the metal and the insulator.

FIG. 1 provides for this object a schematic representation of the potential barrier between a generic metal and the vacuum in three different possible situations.

Generally, it is assumed that the potential energy of an electron passes from zero inside the metal to the value $E_F+\Phi$ immediately outside the surface of the metal. In FIG. 1 this case is represented by the curve (a).

The potential barrier which an electron moving away from the metal encounters has instead a more gradual trend, as it is reasonable to think that initially the potential increases linearly with the distance from the surface of the metal; when an electron reaches the distance of a few Å from this surface it should feel the effect of an attractive force equivalent to the force due to a charge −e, in the presence of which the potential energy of the electron may be represented with a function of the type:

$$V(x) = (E_F + \Phi) - \left(\frac{e^2}{16\pi\varepsilon_0 x}\right)$$

where x represents the distance of the electron from the surface of the metal. In FIG. 1 this case is represented by the curve (b).

Finally, if an electric field is applied in the direction X in the vacuum region surrounding the heated metal, the potential energy of the electron becomes of the type:

$$V(x) = (E_F + \Phi) - \left(\frac{e^2}{16\pi\varepsilon_0 x}\right) - exE$$

where E represents the electric field applied. By performing the derivative of this expression the presence of a maximum of the potential barrier is found, represented in FIG. 1 by the curve (c), which is found at:

$$\begin{cases} x_{max} = (e/16\pi\varepsilon_0 E)^{1/2} \\ V_{max} = V(x) = (E_F + \Phi) - (e^3 E/4\pi\varepsilon_0)^{1/2} \end{cases}$$

As can be seen in FIG. 1, the presence of an external electric field produces a slight decrease in the effective work function. The decrease in the value of the typical work function of the metal in the vacuum is small if the external electric field is not very intense (up to the value of a few thousands of volts/meter): in this case the maximum potential is found at many Å of distance from the external surface of the metal. Even a small decrease in the value of Φ makes the phenomenon of thermal emission possible for many electrons without sufficient energy to pass over the potential barrier in the absence of the external electric field.

When the electric field becomes very intense, around $10^9$ volts/meter, in addition to the decrease in the typical work function of the metal, the phenomenon of field effect emission or electron tunneling also occurs.

The potential barrier that is created at the metal-insulator surface becomes so thin that the electrons of the metal can pass through it by quantum tunneling. At a critical value of the electric field the potential barrier becomes thin enough and the electrons that are on the Fermi level of the metal acquire a finite probability of passing through it. For higher values of the electric field, the even thinner thickness of the potential barrier allows electrons with even lower energies to pass through by tunnel effect.

The current density of emission for field effect is, strictly dependent on the intensity of the electric field, while it is substantially independent from the temperature:

$$j \propto E^2 \exp\left(-\frac{b\Phi}{E}\right)$$

where E represents the intensity of the electric field, Φ represents the height of the potential barrier and b is a constant of proportionality.

It is important to observe that, in the case of emission through electron tunneling, the electrons do not require thermal energizing (and this explains the fact that j does not depend on the temperature), but an intense electric field that reduces the thickness of the potential barrier bending the conduction and valence bands of the insulator means. This explains the strict dependence of j on the intensity of the electric field: in fact, in this case, the electrons do not pass over the potential barrier but tunnel through it.

There should only be a slight probability of tunneling for Fermi level electrons unless the barrier is thinner than 10 Å. Therefore, it is reasonable to expect that the critical value of the electric field above which the phenomenon of emission through field effect will occur is about $3\text{–}10^9$ volts/meter. However, this type of emission also occurs with macroscopic electric fields up to 30 times less intense. It is probable that local roughness in the surface of the metal is the cause of the presence of extremely intense electric fields, although only on a local scale, and that the majority of the emission by field effect comes from these zones.

Inside a percolated metallic system, and; specifically at each metal-vacuum interface, there are local increases in the electric field that make it possible to reach the values of intensity of the electric field required for electron tunneling to take place. It is important to stress that the smaller the dimensions involved in the field emission phenomenon are, the greater the local increase in the electric field is. At each discontinuity of the percolated metallic system, where there is a local increase in the electric field and electron emission takes place by field effect, a local increase in the current density should occur. In fact, just as those deriving from thermal emission, the electrons emitted by field effect contribute to the total electric current. Due to this, the percolated metallic system should have a voltage-current characteristic with non-ohmic trend: the increase in the current with the voltage applied, thanks to the contributions of thermal emission and field effect emission, should be faster than it is in an ohmic conductor with linear characteristics.

In FIG. 2, the numeral 1 indicates as a whole an electroluminescent device produced according to the precepts of the present invention, the operation of which is based on the concepts set forth above.

The device 1 has a "Current In Plane" architecture and is formed of several parts, namely:

- a substrate, indicated with 2;
- two lateral electrodes, indicated with 3;
- a layer of metallic mesoporous material at percolation level, indicated with 4;
- luminescent nanometric inclusions 5 in the layer of percolated material 4;
- a transparent protective layer, indicated with 6.

The substrate 2 may be transparent and produced in common glass, prepared for example with an ultrasound cleaning process, or may be opaque and produced in plastic material. According to the invention, transparent substrates covered with special costly coatings, such as glass covered with ITO, used in O-LED, P-LED and liquid crystal device technology, are not in any case required.

The lateral electrodes 3 are positioned on the glass substrate 2 at the same level and are composed of a continuous metallic layer, deposited by evaporation; the metallic material utilized for the purpose may be copper, silver, gold, aluminum or similar.

The electric contact between the power generator, indicated schematically with "Low $V_{DC}$", of the electroluminescent device 1 and the active layer of the device, composed by the layer 4 of metallic mesoporous material at percolation level, is established through the electrodes 3.

At the ends of the layer 4, the electrodes 3 generate a difference of potential that induces tunneling of electric charge through this layer. If the voltage applied is high enough to create very intense local electric fields ($E \approx 10^7$ V/cm), electron conduction by tunneling as previously described occurs inside the metallic layer 4 at percolation.

The percolation point of a discontinuous metallic system is defined as the point in which the film changes from acting as an insulator, typical of the situation in which the film has a great number of discontinuities in relation to the metallic islands, to act as a conductor, typical of the situation in which as the metallic islands are predominant over the discontinuities in the film, direct "links" between its two ends are formed, in which conduction of electric current can take place.

In a discontinuous metallic film at percolation level there are different electron transport mechanisms. As mentioned, in addition to normal ohmic conduction of the current, other transport mechanisms occur which involve the interface zones between the metal and the discontinuities, in particular thermal emission and electron tunneling.

Thermal emission only occurs in discontinuous films for sufficiently high temperature values, while electron tunneling occurs prevalently in films characterized by a large number of discontinuities of extremely small size, where sufficiently intense local electric fields form.

Evidence of the electron tunneling phenomenon is given by the non-linear trend of the voltage-current characteristic shown by percolated metallic systems. These show a current discharge that occurs at a critical value of the applied voltage. The current discharge proves that the conductibility of the system increases suddenly at the critical voltage value: this means that by applying suitable voltage, at the discontinuities where sufficiently intense electric fields have been created, electron tunneling effect is obtained. The electrons extracted by the metallic islands towards the discontinuity zones contribute to the total current that passes through the system, thus becoming responsible for the current discharge which can be observed at macroscopic level.

It is this very phenomenon which makes the percolated metallic system very interesting for the applications in an electroluminescent device. In fact, electron emission by the metallic islands by electron tunneling effect is used to energize the luminescent particles 5, for instance in the form of semiconductor nanocrystals, metallic nanoparticles or molecules with phosphorescent properties, included in the cavities of the percolated metallic layer 4.

The electrons extracted by the metallic islands by electron tunneling have sufficient energy to energize luminescence in the luminescent nanoparticles enclosed in the matrix composed of the percolated metallic structure. The centers of luminescence with nanometric dimensions may be of various types. In particular they may be produced by:

organic phosphoruses, that is luminescent organic molecules, evaporated together with the metallic structure, among which: Coumarin 7, Alumnium-8-hydroxyquinoline, Spiro compounds, electroluminescent polymers;

inorganic semiconductors (Si, CdSe, CdTe, "core-shell" CdSe/ZnS and CdSe/CdS structures), prepared with self-assembly techniques (which allow control over the diameter of the particles), electrochemical deposition, Langmuir-Blodgett techniques; nanostructures of this type may, if energized by incident electrons with a certain amount of energy, emit photons in the visible field and the near-infrared;

metallic nanocrystals (Au, Ag, Co, Ni, Pt, . . . ), prepared for example chemically by reduction of metallic ions in solution or physically by evaporation of the metal at high temperature; on the nanometric scale, these metals behave similarly to a semiconductor and are capable of emitting, if energized, visible photons or in the near-infrared;

luminescent rare earths, such as metalorganic compounds of europium, terbium (emission in the visible), erbium, ytterbium (emission in the infrared).

The transparent protective layer 6 of the device 1 according to the invention may finally be composed of very thin transparent glass (about 0.5 mm), produced with sol-gel process and deposited on the percolated metallic layer 4 by spin-coating, dip-coating, evaporation or sputtering, or may be produced with another transparent plastic dielectric.

This protective layer 6 does not require the introduction of a polarization film, as required in O-LED technology, for which it is essential to increase the contrast of the output light. The protective layer 6 of the device 1 according to the invention, in addition to being easy to prepare and deposit, thus reduces the total cost of the production process.

In the case shown in FIG. 2, the metallic mesoporous material 4 at percolation level is in the form of a single layer. In accordance with a possible variant, shown schematically in FIG. 3, the effect of extracting the electrons by the metallic islands which constitute the percolated layer may be increased by replacing the single layer 4 of FIG. 2 with a multi-layer percolated system.

Figure 4:
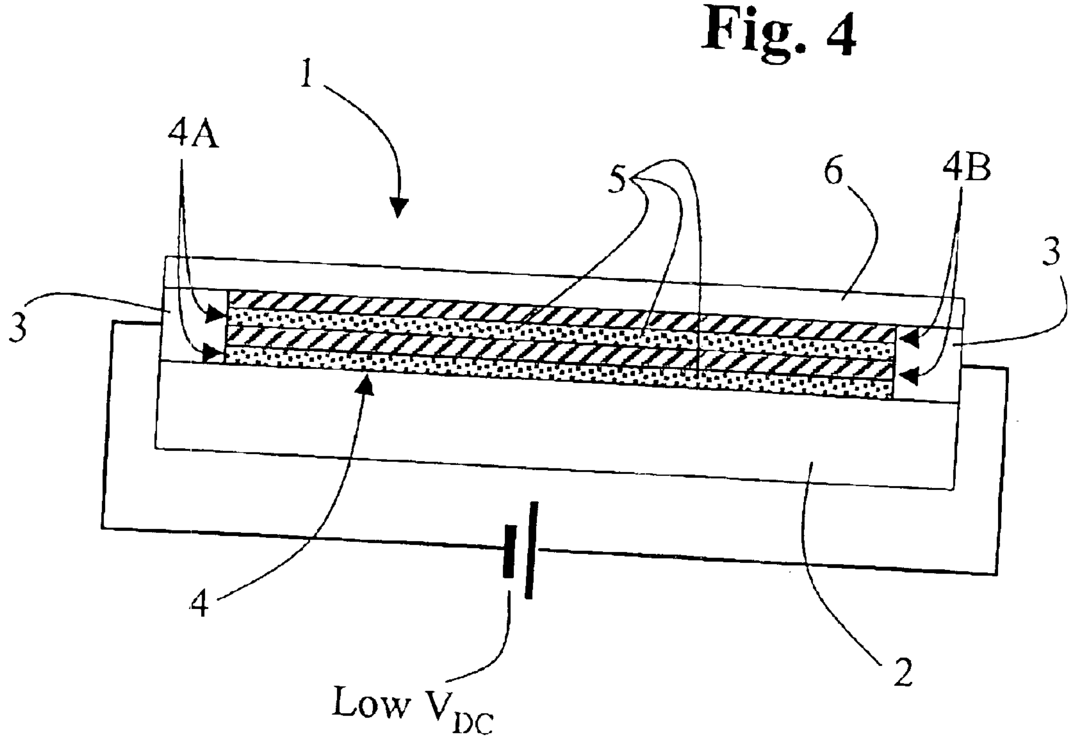
FIG. 4 is a schematic representation of an electroluminescent device produced in accordance with a second possible variant of the present invention.

The different layers may made of different metals or alternately metal/dielectric. In the first case, as shown in FIG. 3, all the layers of the system, indicated with 4A, must be at percolation level, to guarantee the same performances of electron transport obtained in the single layer, and must be distributed so as to be in direct contact with metals with different work functions (or extraction potentials). In the second case, as shown in FIG. 4, the various layers 4A of metal at percolation level must be alternated with discontinuous layers of dielectric material, one of which is indicated with 4B. The discontinuity of the dielectric layers 4B is essential to guarantee electric conduction throughout the multi-layer system (and not through each single metallic layer).

It is known that phenomena of electron emission by a metal, either due to thermal emission or electron tunneling, increase in intensity when atoms of an element characterized by a low work function are distributed on the surface of a metal characterized by a high work function value, and vice versa. The multi-layer solution ensures the electroluminescent device has an extremely vast contact area, which increases the possibilities of contact between metallic islands of different elements and contributes towards increasing the number of electrons extracted by tunneling effect. Combinations of metals for which electron emission by tunneling effect is possible for a few ElectronVolts applied to continuous electrodes are: Ca—Al, Ca—Ag, Ca—Cu, Ca—Au, Al—Au, Ag—Au.

The characteristics of the invention are clear from the description given. As well as increased stability, the advantages the new electroluminescent device draws from the characteristics of the percolated metallic layer include:

the possibility of obtaining light emission in both directions, as a metallic system at percolation level is almost completely transparent;

the use of solutions with multi-layer of different layers of discontinuous films has the advantage of increasing the total volume from which light is emitted.

It is clear to those skilled in the art that there are numerous possible variants to the electroluminescent device described as an example, without however departing from the scopes of intrinsic novelty of the invention.

What is claimed is:

1. An electroluminescent device (1) comprising:

a glass or plastic supporting substrate (2);

at least two electrodes (3) positioned on said substrate (2);

at least a three-dimensional percolated layer (4;4A) positioned on said substrate (2) between said electrodes (3), said three-dimensional percolated layer (4;4A) having a metallic mesoporous structure defining a multitude of cavities with micrometric or nanometric dimensions, said structure being in particular composed of metallic interconnections or metallic dielectrics interconnections connected so as to guarantee electric conduction;

a multitude of luminescent inclusions (5), in particular in the form of nanoparticles or macromolecules, housed in respective cavities of said three-dimensional percolated layer (4;4A), where said luminescent inclusions (5) are operative to emit light when energized by electrons which, as a result of electron tunneling effect, pass through said three-dimensional percolated layer (4;4A).

2. Device according to claim 1, characterized in that said electrodes (3) are operative to establish the electric contact between an external power generator (Low $V_{DC}$) and said three-dimensional percolated layer (4;4A), in order to generate to the ends of the latter a potential difference which induces transport of electric charge through the layer.

3. Device according to claim 1, characterized in that it is provided with a protective layer (6) of said three-dimensional percolated layer (4;4A).

4. Device according to claim 1, characterized in that said substrate (2) is produced in glass or plastic material.

5. Device according to claim 1, characterized in that said electrodes (3) are composed of a respective continuous metallic layer.

6. Device according to claim 1, characterized in that said continuous metallic layer is deposited by evaporation on said substrate (2).

7. Device according to claim 5, characterized in that said metallic layer is composed of a material selected in the group comprising copper, silver, gold, aluminum, platinum and nickel.

8. Device according to claim 1, characterized in that said luminescent inclusion (5) are in the form of semiconductor nanocrystals, metallic nanoparticles or molecules with phosphorescent properties.

9. Device according to claim 1, characterized in that said luminescent inclusions (5) are in the form of organic phosphoruses, such as Coumarin 7, Alumnium-8-hydroxyquinoline, Spiro compounds, electroluminescent polymers.

10. Device according to claim 1, characterized in that said luminescent inclusions (5) are in the form of inorganic semiconductors, such as Si, CdSe, CdTe, "core-shell" CdSe/ZnS and CdSe/CdS structures.

11. Device according to claim 1, wherein said luminescent inclusions (5) are in the form or metallic nanocrystals.

12. Device according to claim 1, characterized in that said luminescent inclusions (5) are in the form of luminescent rare earths, such as metalorganic compounds of europium, terbium, erbium and ytterbium.

13. Device according to claim 3, characterized in that said protective layer (6) is made of glass or another transparent plastic dielectric.

14. Device according to claim 1, characterized in that said glass is produced with sol-gel process and deposited on said percolated metallic layer (4; 4A) by spin-coating, by dip-coating, by evaporation or by sputtering.

15. Device according to claim 1, characterized in that it is provided with a plurality of three-dimensional percolated layers (4A).

16. Device according to claim 1, characterized in that said layers (4A) are made of metals differing from one another or according to a repeated layout of the type metal-dielectric-metal-dialectric.

17. Device according to claim 15, characterized in that said layers (4A) are made of one metal alternated with discontinuous layers of dielectric material (4B).

* * * * *

UNITED STATES PATENT AND TRADEMARK OFFICE
CERTIFICATE OF CORRECTION

PATENT NO. : 6,861,674 B2
DATED : March 1, 2005
INVENTOR(S) : Piero Perlo et al.

It is certified that error appears in the above-identified patent and that said Letters Patent is hereby corrected as shown below:

Title page,
Item [30], Foreign Application Prirority Data, please change
"Dec. 18, 2002 (IT)..................... TO2002A0033" to
-- Jan. 11, 2002......................... TO2002A0033 --.

Signed and Sealed this

Twenty-third Day of August, 2005

JON W. DUDAS
*Director of the United States Patent and Trademark Office*